United States Patent
Huang et al.

(10) Patent No.: US 7,528,640 B2
(45) Date of Patent: May 5, 2009

(54) DIGITAL PULSE-WIDTH CONTROL APPARATUS

(75) Inventors: Hong-Yi Huang, Taipei (TW);
Shiun-Dian Jan, Taipei County (TW);
Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/748,492

(22) Filed: May 15, 2007

(65) Prior Publication Data
US 2008/0143402 A1 Jun. 19, 2008

(30) Foreign Application Priority Data
Dec. 15, 2006 (TW) .............................. 95147030 A

(51) Int. Cl.
*H03K 3/017* (2006.01)
(52) U.S. Cl. ...................................... 327/172; 327/175

(58) Field of Classification Search ...................... None
See application file for complete search history.

(56) References Cited

U.S. PATENT DOCUMENTS 7,312,668 B2 * 12/2007 Li et al. .......................... 331/57
2006/0214712 A1 * 9/2006 O'Malley et al. ............ 327/175

OTHER PUBLICATIONS

Article titled "All Digital Pulsewidth Control Loop With Real Time Output" authored by Huang et al., 17th VLSI Design/CAD Symposium, Aug. 8-11, 2006.

* cited by examiner

*Primary Examiner*—Cassandra Cox
(74) *Attorney, Agent, or Firm*—Jianq Chyun IP Office

(57) ABSTRACT

A digital pulse-width control apparatus including an input module, a digital delay locked loop, a plurality of programmable delay circuits connected in series, and a pulse-width modulation module is provided. The present invention uses the input module to vary a clock signal to reduce the limitation of a duty cycle of the clock signal to the digital pulse-width control apparatus.

16 Claims, 12 Drawing Sheets

DIGITAL PULSE-WIDTH CONTROL APPARATUS

CROSS-REFERENCE TO RELATED APPLICATION

This application claims the priority benefit of Taiwan application serial no. 95147030, filed Dec. 15, 2006. All disclosure of the Taiwan application is incorporated herein by reference.

BACKGROUND OF THE INVENTION

1. Field of the Invention

The present invention relates to a digital pulse-width control apparatus. More particularly, the present invention relates to a digital pulse-width control apparatus free from an influence of a duty cycle of a clock signal.

2. Description of Related Art

For high-speed very large scale integrated (VLSI) circuits, in order to ensure the accuracy of duty cycle of a clock, a pulse-width control apparatus is developed. According to the circuit designs, pulse-width control apparatuses are classified into digital and analog types. The digital pulse-width control apparatuses have fine resistance to noises, and have the advantages of fast locking and stable systems, so they are currently widely applied in VLSI circuits.

FIG. 1 is an architectural view of a conventional digital pulse-width control apparatus. Referring to FIG. 1, the conventional digital pulse-width control apparatus 100 includes a compensation delay line 110, a delay line 120, pulse-width generators 130 and 140, an SR flip-flop 150, a clock driver 160, an up/down counter 170, a pulse-width comparator 180, and a digital pulse-width converter 190. The digital pulse-width converter 190 detects a clock signal $V_{OUT1}$, and generates a detection code $C_{11}$ according to a detection result. Thus, the pulse-width comparator 180 determines the detection code $C_{11}$ according to a pulse-width control information $S_{11}$, and generates a counting information $S_{12}$ and a locking information $S_{13}$ according to the determination result. The up/down counter 170 counts up or down according to the counting information $S_{12}$, so as to regulate and output a delay control code $C_{12}$.

At this time, the delay line 120 transmits and inputs a clock signal $V_{IN1}$ to the pulse-width generator 140 according to the delay time determined by the delay control code $C_{12}$. In another aspect, taking the impact of parasitic capacitance and parasitic resistance to the delay line 120 into consideration, the input clock signal $V_{IN1}$ is also transmitted to the pulse-width generator 130 through the compensation delay line 110. Then, the SR flip-flop 150 generates the output clock signal $V_{OUT1}$ according to output signals of the pulse-width generators 130 and 140, and transmits the output clock signal $V_{OUT1}$ back to the digital pulse-width converter 190 through the clock driver 160.

Thus, the conventional digital pulse-width control apparatus 100 forms a feedback mechanism, through which the detecting, determining, and regulating operations are repeated continuously until the output clock signal $V_{OUT1}$ is locked. However, in actual applications, the range of the duty cycle of the input clock signal $V_{IN1}$ is limited by the circuit characteristics of the compensation delay line 110 and the delay line 120. As the digital pulse-width converter 190 cannot find a balance between the layout area and the resolution of detection, the range of the duty cycle of the output clock signal $V_{OUT1}$ is greatly limited.

FIG. 2 is an architectural view of another conventional digital pulse-width control apparatus. Referring to FIG. 2, the conventional digital pulse-width control apparatus 200 includes a half-period delay line 210 and an SR flip-flop 220. In the overall operation, the half-period delay line 210 is used to delay an input clock signal $V_{IN2}$ for half a period, and then output it as a delayed clock signal $V_{S2}$. Then, the SR flip-flip 220 determines positive transition points of the input clock signal $V_{IN2}$ and the delayed clock signal $V_{S2}$, so as to generate an output clock signal $V_{OUT2}$ with a duty cycle of 50% accordingly.

The conventional digital pulse-width control apparatus 200 has been widely applied in correction circuits currently due to its high correction speed and negligible errors. However, the conventional pulse-width control apparatus 200 has an inevitable defect, that is, the duty cycle of the output clock signal $V_{OUT2}$ is fixed to be 50%. Therefore, the conventional digital pulse-width control apparatus 200 cannot change the duty cycle of the output clock signal $V_{OUT2}$ according to system requirements.

FIG. 3 is an architectural view of still another conventional digital pulse-width control apparatus. Referring to FIG. 3, the conventional digital pulse-width control apparatus 300 includes a clock width modulator 310, a clock buffer 320, a clock width converter 330, a comparator 340, a loop filter 350, and a frequency divider 360. The clock width modulator 310 regulates a pulse-width of an input clock signal $V_{IN3}$ according to a pulse-width control code $C_{31}$ generated by the loop filter 350. Then, the regulated input clock signal $V_{IN3}$ is amplified by the clock buffer 320, and is converted into an output clock signal $V_{OUT3}$. In another aspect, the clock width converter 330 converts a waveform of the output clock signal $V_{OUT3}$ into a digital code $C_{32}$. The comparator 340 compares the digital code $C_{32}$ with a duty cycle control code $C_{33}$, and transmits the comparison result to the loop filter 350. At this time, the loop filter 350 receives the input clock signal after the frequency division, and regulates the pulse-width control code $C_{31}$ according to the comparison result generated by the comparator 340.

By repeating the detecting, determining, and regulating operations continuously, the conventional digital pulse-width control apparatus 300 finally assumes a locked state, and generates the output clock signal $V_{out3}$ accordingly. However, in actual applications, the clock width modulator 310 cannot regulate the input clock signal $V_{IN3}$ of different frequencies with a same detection resolution. Therefore, the duty cycle of the clock signal $V_{out3}$ provided by the conventional digital pulse-width control apparatus 300 is in a very narrow range. Similarly, as the minimum pulse width that the clock buffer 320 can transmit is limited, the range of the duty cycle of the input clock signal $V_{IN3}$ is also greatly limited.

SUMMARY OF THE INVENTION

The present invention is directed to a digital pulse-width control apparatus, which uses an input module to vary a clock signal, so as to reduce the limitation of a duty cycle of the clock signal on the digital pulse-width control apparatus.

The present invention is also directed to a digital pulse-width control apparatus, which uses a pulse-width modulation module to generate an adjustable clock signal or an anti-phase signal of the adjustable clock signal, so as to reduce the number of programmable delay circuits.

The present invention provides a digital pulse-width control apparatus, which includes an input module, a digital delay locked loop, a plurality of programmable delay circuits connected in series and a pulse-width modulation module.

The digital pulse-width control apparatus uses the input module to receive the clock signal, and the input module to regulate the clock signal to a specific period signal and a specific pulse-width signal respectively. Here, the digital delay locked loop receives the specific period signal, and generates a specific delay control code in a locked state. Each of the controllable delay circuits sequentially transmits the specific pulse-width signal according to the delay time determined by the specific delay control code.

It should be noted that the total delay time of the plurality of programmable delay circuits is 0.5 times of the period of the specific pulse-width signal. Therefore, the pulse-width modulation module selects one of output signals of the plurality of programmable delay circuits to function as a delay clock signal according to the pulse-width control code. Next, the pulse-width modulation module compares transition points of the specific pulse-width signal and the delay clock signal, so as to generate an adjustable clock signal or an anti-phase signal of the adjustable clock signal.

According to another aspect of the present invention, a digital pulse-width control apparatus is provided, which includes an input module, a digital delay locked loop, a plurality of programmable delay circuits connected in series and a pulse-width modulation module. The digital delay locked loop includes ($2^{K+1}$) controllable delay circuits connected in series, a phase detecting unit and a delay control unit.

The digital pulse-width control apparatus uses the input module to receive the clock signal, and the input module is used to regulate the clock signal to a specific period signal and a specific pulse-width signal respectively.

Moreover, each of the controllable delay circuits in the digital delay locked loop transmits the specific period signal according to the delay time determined by a delay control code, wherein K is a positive integer. The phase detecting unit samples the specific period signal at the transition points of the specific period signal transmitted by each of the controllable delay circuits, and determines the sample result to provide a counting information or a locking information.

According to another aspect of the present invention, the delay control unit enables the delay control code to increase or reduce according to the counting information, and enables the delay control code to remain unchanged according to the locking information, so as to further generate a specific delay control code. Thus, when the digital delay locked loop remains in the locked state and outputs a specific delay control code, the $2^{K-1}$ programmable delay circuits connected in series transmit the specific pulse-width signal according to the delay time determined by the specific delay control code.

It should be noted that when the digital delay locked loop is in the locked state, a $(2^K)^{th}$ controllable delay circuit of the digital delay locked loop can generate a phase locked signal, and the phase locked signal and the specific period signal have opposite phases.

Moreover, as total delay time of the $2^{K-1}$ programmable delay circuits in the digital pulse-width control apparatus is 0.5 times that of the specific pulse-width signal, the pulse-width modulation module selects one of output signals of the plurality of programmable delay circuits to function as a delay clock signal according to the pulse-width control code. Next, the pulse-width modulation module compares transition points of the specific pulse-width signal and the delay clock signal to generate an adjustable clock signal or an anti-phase signal of the adjustable clock signal.

The present invention uses the input module to reduce the limitation of the duty cycle of the clock signal on the digital pulse-width control apparatus. In another aspect, the circuit structure formed by the pulse-width modulation module, the digital delay locked loop, and a plurality of programmable delay circuit expands the range of the duty cycle of the output clock signal, and reduces the circuit layout area of the digital pulse-width control apparatus as well.

In order to make the aforementioned and other objects, features and advantages of the present invention comprehensible, embodiments accompanied with figures are described in detail below.

It is to be understood that both the foregoing general description and the following detailed description are exemplary, and are intterminaled to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
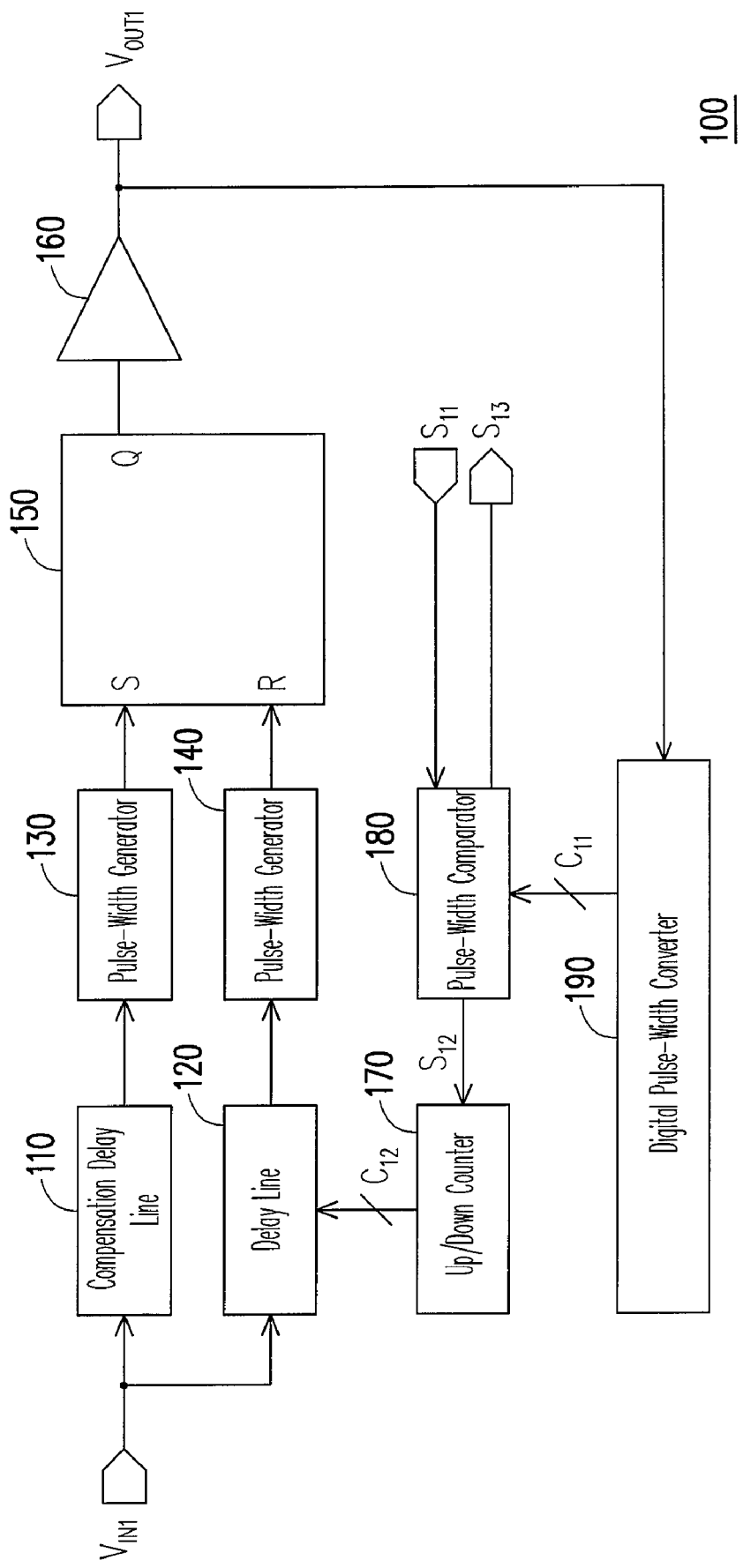
FIG. 1 is an architectural view of a conventional digital pulse-width control apparatus.
Figure 2:
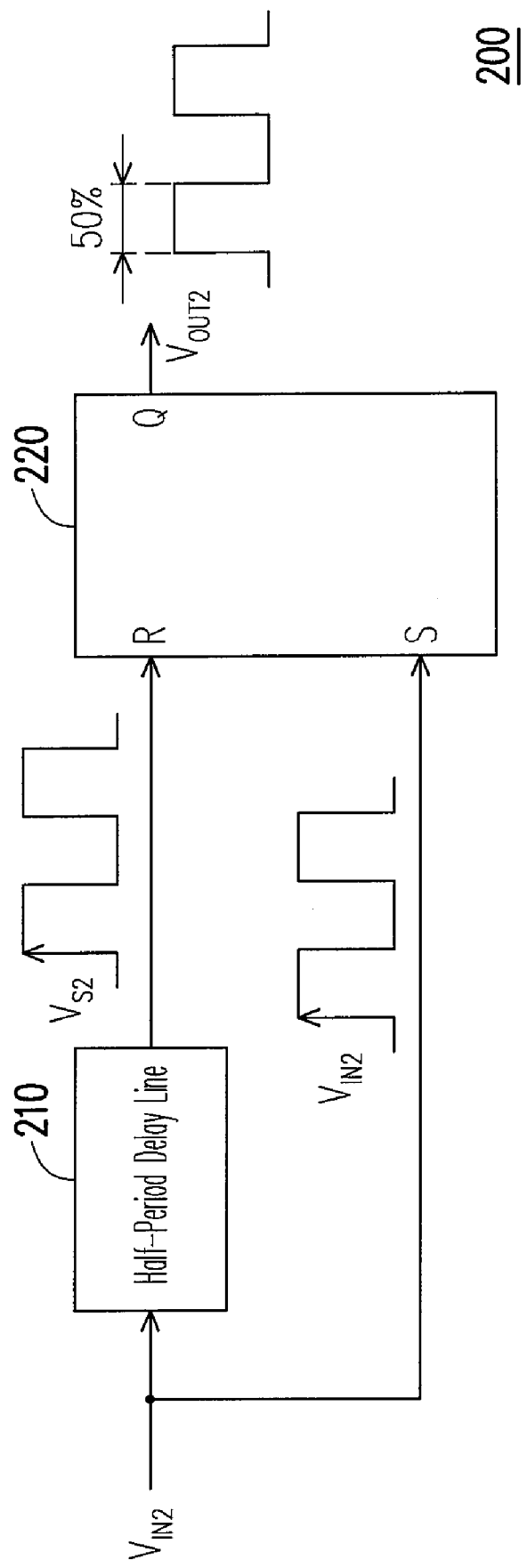
FIG. 2 is an architectural view of another conventional digital pulse-width control apparatus.
Figure 3:
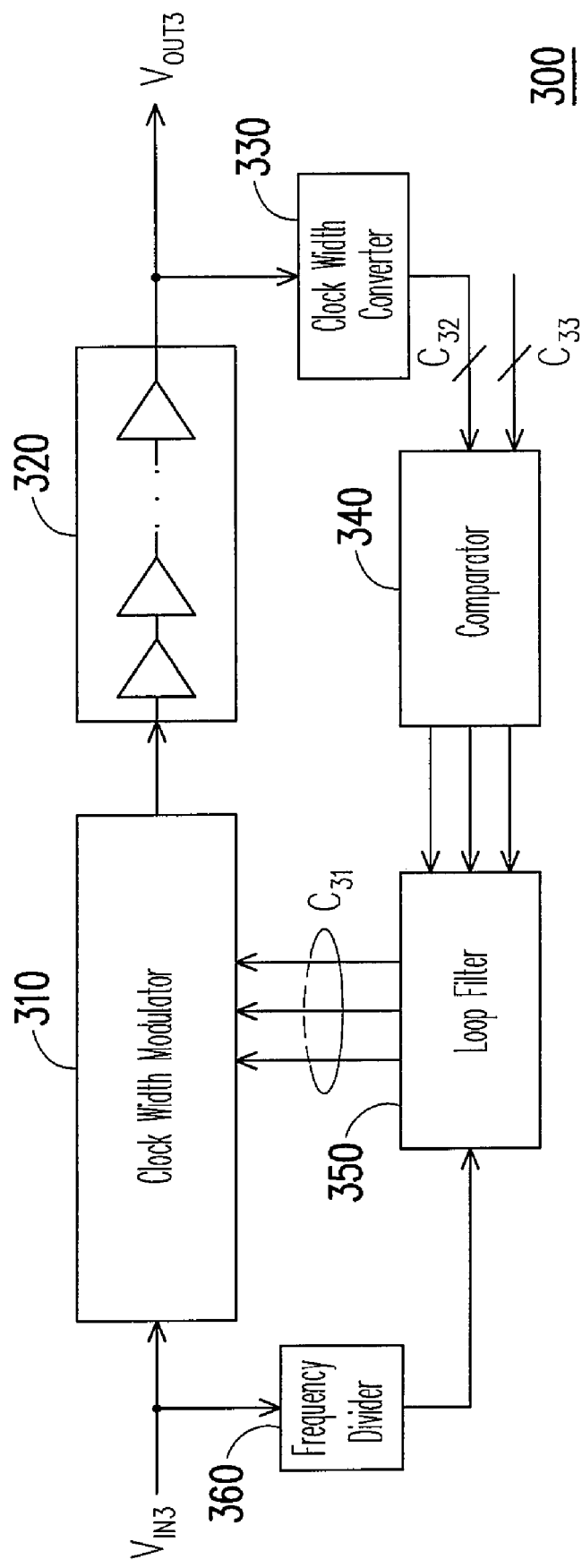
FIG. 3 is an architectural view of still another conventional digital pulse-width control apparatus.
Figure 4:
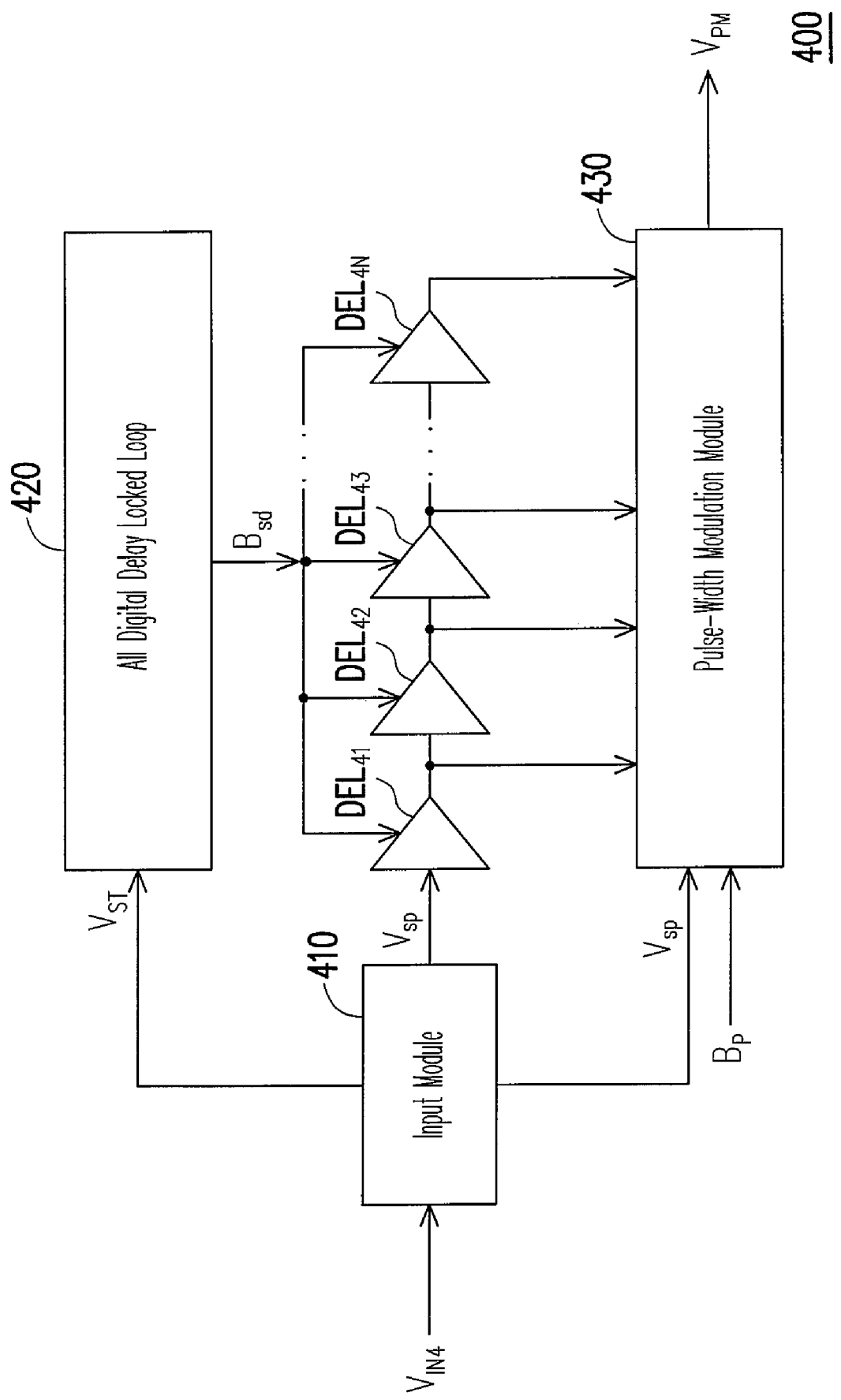
FIG. 4 is an architectural view of a digital pulse-width control apparatus according to an embodiment of the present invention.

FIG. 4 is an architectural view of a digital pulse-width control apparatus according to an embodiment of the present invention. Referring to FIG. 4, the digital pulse-width control apparatus 400 includes an input module 410, a digital delay locked loop 420, programmable delay circuits $DEL_{41}$-$DEL_{4N}$ and a pulse-width modulation module 430, wherein N is a positive integer. The digital delay locked loop 420 and the pulse-width modulation module 430 are coupled to the input module 410. The programmable delay circuits $DEL_{41}$-$DEL_{4N}$ are connected in series, an input terminal of the programmable delay circuit $DEL_{41}$ is coupled to the input module 410, and output terminals of the programmable delay circuits $DEL_{41}$-$DEL_{4N}$ are coupled to the pulse-width modulation module 430.

In order to avoid the clock signal $V_{IN4}$ disappearing in transmission when the pulse-width of the clock signal $V_{IN4}$ is very narrow, the digital pulse-width control apparatus 400 uses the input module 410 to receive the clock signal $V_{IN4}$.

Figure 5:
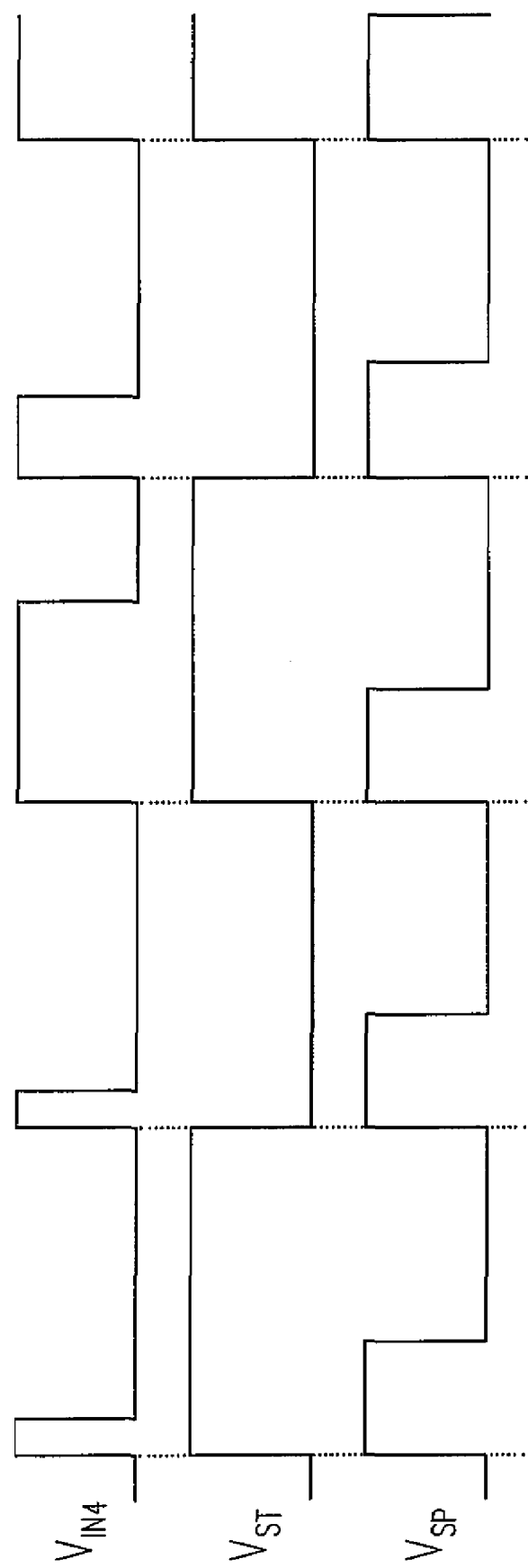
FIG. 5 is a relevant timing diagram to illustrate the input module.

Here, with reference to the timing diagram of the input module shown in FIG. 5, when the digital delay locked loop 420 receives the clock signal $V_{IN4}$ and the pulse-width of the clock signal $V_{IN4}$ always changes, the input module 410 regulates the clock signal $V_{IN4}$ to a specific period signal $V_{ST}$ and a specific pulse-width signal $V_{SP}$ respectively. As shown in FIG. 5, the duty cycle of the specific period signal $V_{ST}$ is 50%, and the pulse-width of the specific pulse-width signal $V_{SP}$ is directly proportional to a specific time.

According to another aspect of the present invention, the digital delay locked loop 420 receives the specific period signal $V_{ST}$, and generates a specific delay control code $B_{sd}$ in a locked state. Thus, the controllable delay circuits $DEL_{41}$-$DEL_{4}N$ sequentially transmits the specific pulse-width signal $V_{SP}$ according to delay time determined by the specific delay control code $B_{sd}$.

It should be noted that the total delay time of the programmable delay circuits $DEL_{41}$-$DEL_{4N}$ is 0.5 times of the period of the specific pulse-width signal $V_{SP}$. Therefore, the pulse-width modulation module 430 selects one of output signals of the programmable delay circuits $DEL_{41}$-$DEL_{4N}$ to function as a delay clock signal $V_{DE}$ according to a pulse-width control code $B_P$. Next, the pulse-width modulation module 430 compares transition points of the specific pulse-width signal and the delay clock signal $V_{DE}$, so as to generate an adjustable clock signal $V_{PG}$ or an anti-phase signal $V_{PGB}$ of the clock signal.

For example, it is assumed that a resolution of the pulse-width control code $B_P$ is K bits, which are represented as $B_P[1]$-$B_P[K]$ respectively. Moreover, when the resolution of the pulse-width control code $B_P$ is K bits, the digital pulse-width control apparatus 400 includes $2^{\wedge}(K-1)$ programmable delay circuits, in other words, $N=2^{\wedge}(K-1)$ at this time. Referring to the relevant timing diagram of the pulse-width modulation module of FIG. 6, the pulse-width modulation module 430 generates a delay clock signal $V_{DE}$ according to the pulse-width control code $B_P$. Next, the pulse-width modulation module 430 generates an adjustable clock signal $V_{PG}$ and an anti-phase signal $V_{PGB}$ of the adjustable clock signal according to a phase difference between the delay clock signal $V_{DE}$ and the compensated specific pulse-width signal (shown as $V_{MT}$).

Finally, the pulse-width modulation module 430 determines to output the adjustable clock signal $V_{PG}$ or the anti-phase signal $V_{PGB}$ of the adjustable clock signal according to a bit $B_P[K]$ in the pulse-width control code $B_P$. For example, it is assumed that the output signal of the pulse-width modulation module 430 is $V_{PM}$, then in period T1, the output signal $V_{PM}$ generated by the pulse-width modulation module 430 according to $B_P[K]$ at a logic low level is the adjustable clock signal $V_{PG}$. In period T2, the output signal $V_{PM}$ generated by the pulse-width modulation module 430 according to $B_P[K]$ at a logic high level is the anti-phase signal $V_{PGB}$ of the adjustable clock signal.

In order to make the embodiment of the present invention apparent to persons skilled in the art, the sub-blocks of the digital delay locked loop 400 will be illustrated in detail as follows.

Figure 7:
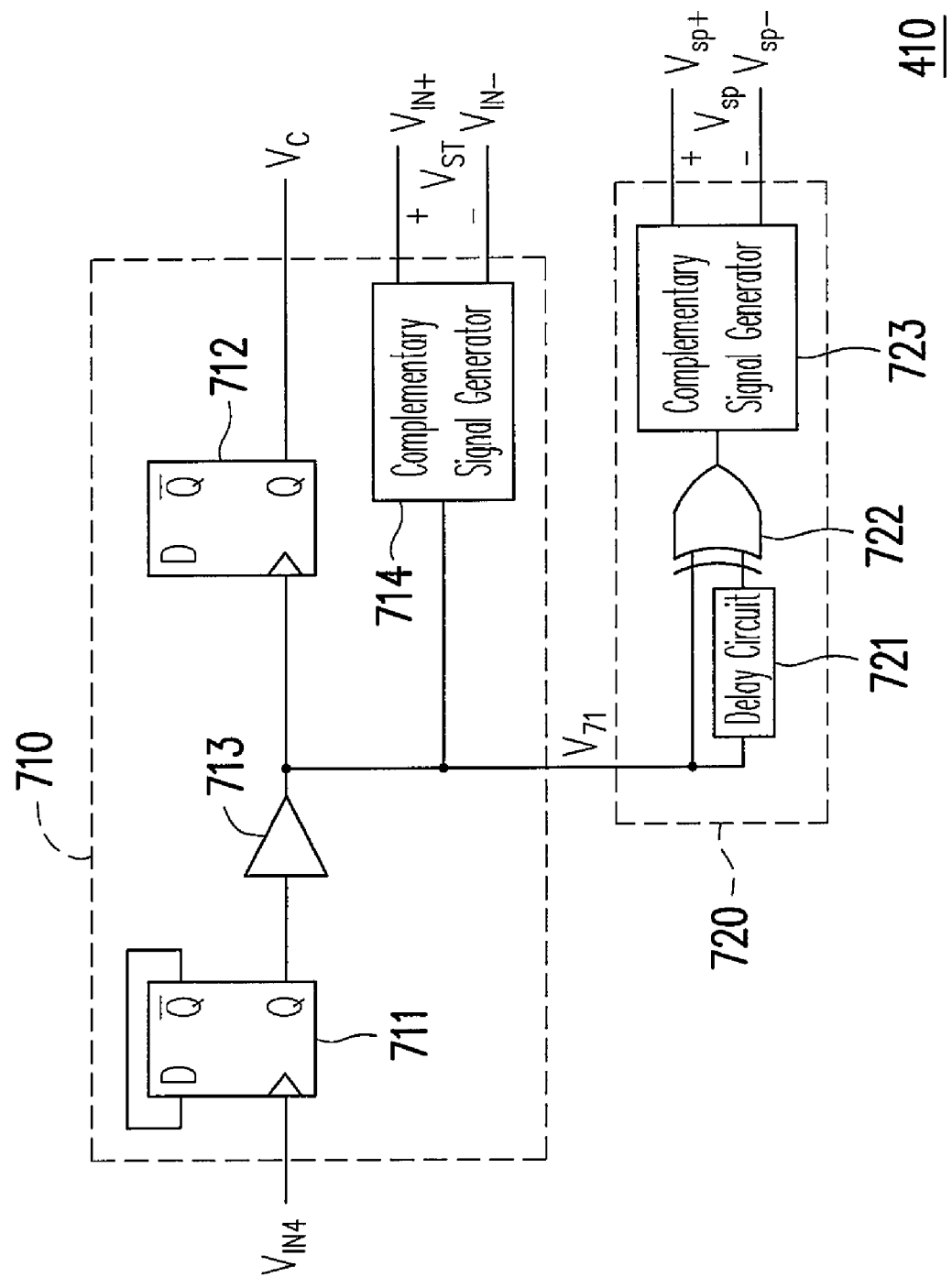
FIG. 7 is an architectural view of the input module according to an embodiment of the present invention.

FIG. 7 is an architectural view of the input module according to the embodiment of the present invention. Referring to FIG. 7, the input module 410 includes a frequency dividing unit 710 and an up-conversion unit 720. The frequency dividing unit 710 receives the clock signal $V_{IN}$, and reduces the frequency of the clock signal $V_{IN4}$ to the specific period signal $V_{ST}$ by a specific factor. In another aspect, the up-conversion unit 720 coupled to the frequency dividing unit 710 raises the frequency of the output signal of the frequency dividing unit to the specific pulse-width signal $V_{SP}$ by a specific factor. Here, the pulse-width of the specific pulse-width signal $V_{SP}$ is in direct proportion to a specific time.

Furthermore, the frequency dividing unit 710 includes D flip-flops 711 and 712, a buffer 713, and a complementary signal generator 714. The buffer 713 is coupled to a positive-phase output terminal of the D flip-flop 711. A trigger terminal of the D flip-flop 712 and the complementary signal generator 714 are coupled to an output terminal of the buffer 713, respectively.

Here, a trigger terminal of the D flip-flop 711 receives the clock signal $V_{IN4}$, and the D flip-flop 711 having an input terminal and an anti-phase output terminal coupled with its input terminal divides the frequency of the clock signal $V_{IN4}$ by the specific factor (2 times), so as to generate the output signal with the duty cycle of 50%. Next, the buffer 713 improves the driving capability of the D flip-flop 711, so as to generate the specific period signal $V_{ST}$. The operating mechanism of the digital delay locked loop 420 must use differential signals of the specific period signal $V_{ST}$ and a counting signal $V_C$. Therefore, the complementary signal generator 714 generates the differential signals corresponding to the specific period signal $V_{ST}$ and outputs the differential signals as a positive received signal $V_{IN+}$ and a negative received signal $V_{IN-}$ respectively. The positive received signal $V_{IN+}$ and the negative received signal $V_{IN-}$ are differential signals of the specific period signal $V_{ST}$. In another aspect, the D flip-flop 712 having an input terminal and an anti-phase output terminal coupled with its input terminal provides a counting signal $V_C$ through a positive-phase output terminal.

In another aspect, the up-conversion unit 720 includes a delay circuit 721, an XOR gate 722 and a complementary signal generator 723. The XOR gate 722 is coupled to the frequency dividing unit 710 and the delay circuit 721. The complementary signal generator 723 is coupled to the XOR gate 722.

Figure 8:
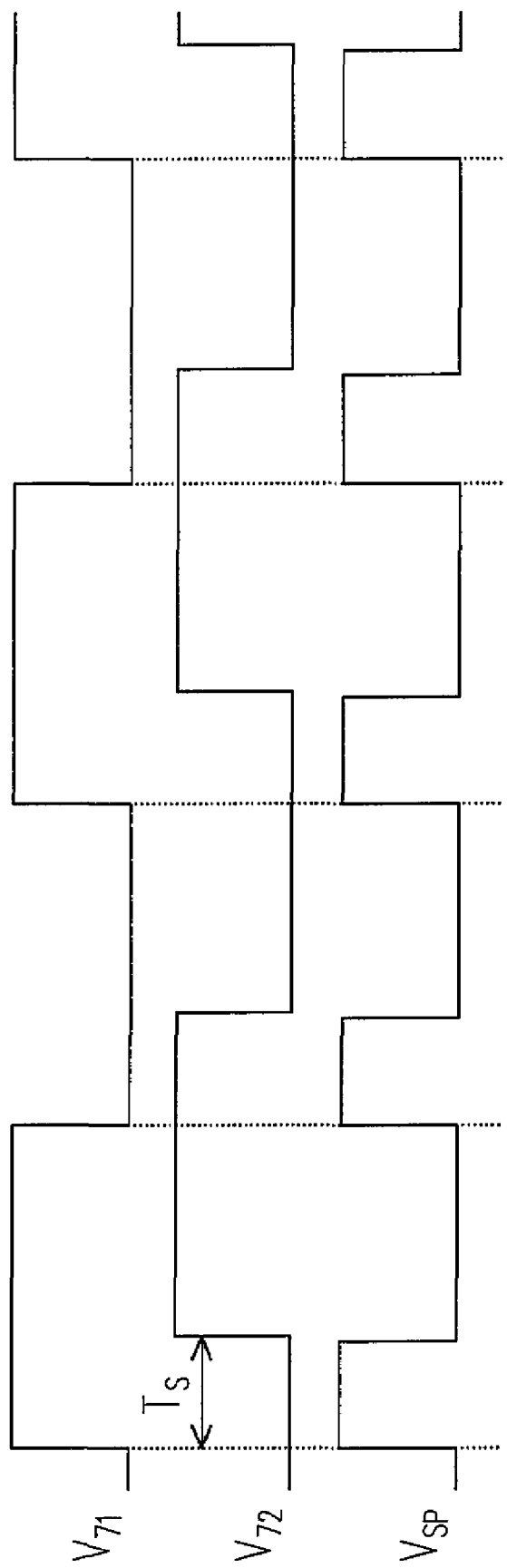
FIG. 8 is a timing diagram to illustrate the embodiment of FIG. 7.

FIG. 8 is a timing diagram to illustrate the embodiment of FIG. 7. Referring to FIGS. 7 and 8 together, the delay circuit 721 delays an output signal (signal $V_{71}$) of the frequency dividing unit 710 for a specific time $T_S$, and then outputs it. Here, the signal $V_{71}$ (the output signal of the delay circuit 721) after being delayed for the specific time $T_S$ is indicated by signal $V_{72}$ in FIG. 8. In the overall operation, the combination of the XOR gate 722 and the delay circuit 721 provides the function of raising the frequency. Therefore, through the operation of the XOR gate 722 and the delay circuit 721, the frequency of the signal $V_{71}$ is raised to the specific pulse-width signal $V_{SP}$ by a specific factor (2 times). As shown in FIG. 8, the pulse-width of the specific pulse-width signal $V_{SP}$ is directly proportional to the specific time $T_S$.

In addition, the programmable delay circuits $DEL_{41}$-$DEL_{4N}$ must use differential signals of the specific pulse-width signal $V_{SP}$. Therefore, the complementary signal generator 723 generates the differential signals corresponding to the specific pulse-width signal $V_{SP}$, and outputs the differential signals as a positive pulse signal $V_{SP+}$ and a negative pulse signal $V_{SP-}$ respectively. Here, the positive pulse signal $V_{SP+}$ and the negative pulse signal $V_{SP-}$ are the differential signals of the specific pulse-width signal $V_{SP}$.

Figure 9:
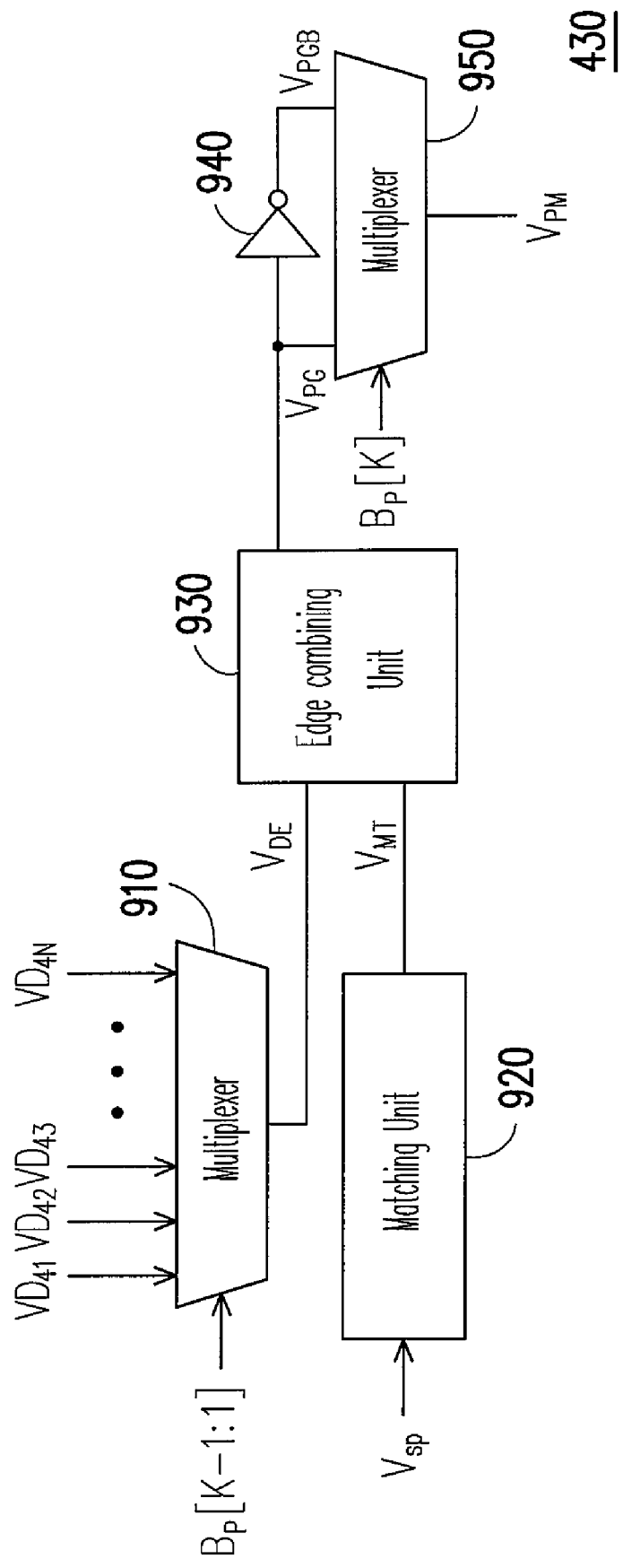
FIG. 9 is an architectural view of the pulse-width modulation module according to an embodiment of the present invention.

FIG. 9 is an architectural view of the pulse-width modulation module according to the embodiment of the present invention. Referring to FIG. 9, a pulse-width modulation module 430 includes multiplexers 910 and 950, a matching unit 920, an edge combining unit 930 and an inverter 940. The edge combining unit 930 is coupled to output terminals of the multiplexer 910 and the matching unit 920. An input terminal of the inverter 940 is coupled to the edge combining unit 930, and the input terminal and an output terminal of the inverter 940 are coupled to the multiplexer 950.

Figure 6:
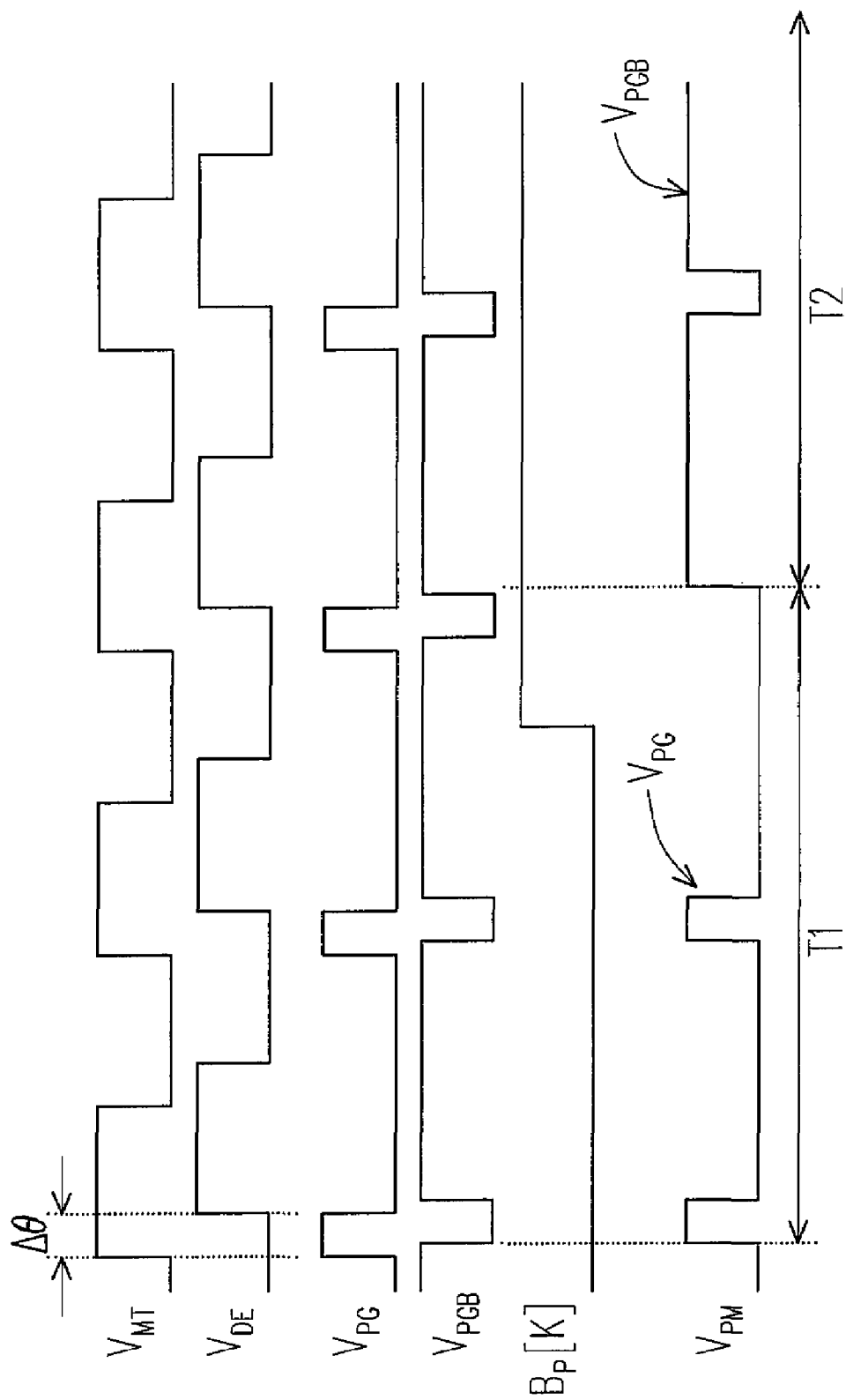
FIG. 6 is a relevant timing diagram to illustrate the pulse-width modulation module.

Here, output signals of the programmable delay circuit $DEL_{41}$-$DEL_{4N}$ are represented as $VD_{41}$-$VD_{4N}$ respectively, and $B_P[K-1:1]$ stands for the $(K-1)^{th\ to\ the}$ $1^{st}$ bits of the pulse-width control code $B_P$ respectively. Referring to FIGS. 6 and 9 together, the multiplexer 910 selects and outputs one of the signals $VD_{41}$-$VD_{4N}$ as the delay clock signal $V_{DE}$ according to the pulse-width control code $B_P[K-1:1]$. In order to compensate the influence of the parasitic capacitance and the parasitic resistance to the specific pulse-width signal $V_{SP}$, the edge combining unit 930 uses the matching unit 920 to receive the specific pulse-width signal $V_{SP}$. Here, the matching unit 920 receives and delays the specific pulse-width signal $V_{SP}$, so as to output the compensated specific pulse-width signal as a matched clock signal $V_{MT}$.

Thus, the edge combining unit 930 uses a phase difference $\Delta\theta$ between the delay clock signal $V_{DE}$ and the matched clock signal $V_{MT}$ to generate the adjustable clock signal $V_{PG}$, and a pulse-width of the adjustable clock signal $V_{PG}$ is in direct proportion to the phase difference $\Delta\theta$. In other words, as the delay clock signal $V_{DE}$ is one of the signals $VD_{41}$-$VD_{4N}$, the phase difference $\Delta\theta$ changes corresponding to a different delay clock signal $V_{DE}$. Furthermore, the pulse-width of the adjustable clock signal $V_{PG}$ also changes corresponding to the pulse-width control code $B_P[K-1:1]$. Next, the inverter 940 receives the adjustable clock signal $V_{PG}$, so as to generate the anti-phase signal $V_{PGB}$ of the adjustable clock signal. Thus, the multiplexer 950 selects one of the adjustable clock signal $V_{PG}$ and the anti-phase signal $V_{PGB}$ of the adjustable clock signal, and outputs the selected signal as an output signal $V_{PM}$.

Figure 10:
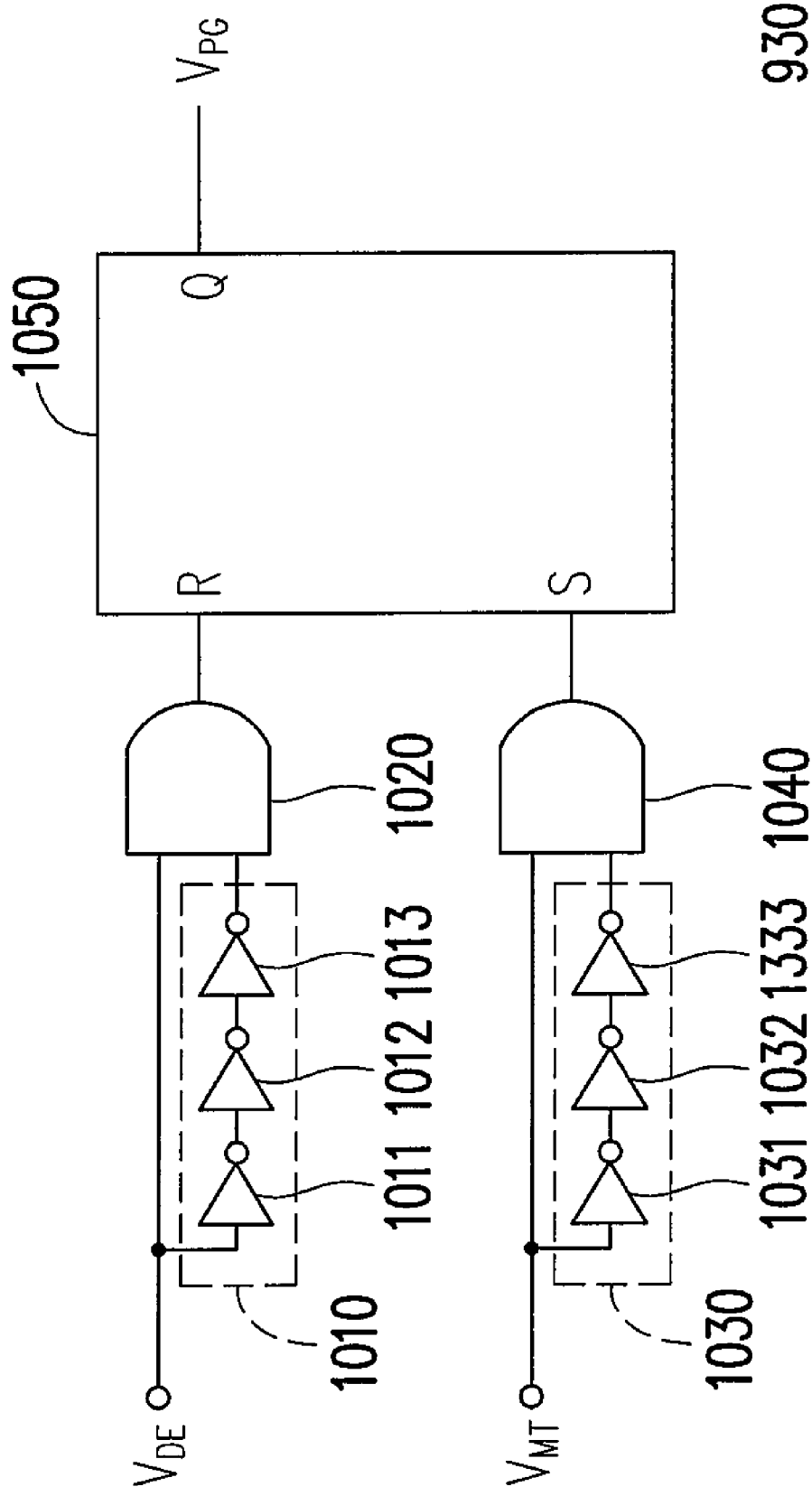
FIG. 10 is an architectural view of an edge combining unit according to an embodiment of the present invention.

Furthermore, FIG. 10 is an architectural diagram of the edge combining unit according to the embodiment of the present invention. Referring to FIG. 10, an edge combining unit 930 includes delay units 1010 and 1030, AND gates 1020 and 1040, and an SR flip-flop 1050. A first terminal of the AND gate 1020 is coupled to an input terminal of the delay unit 1010, and a second terminal is coupled to an output terminal of the delay unit 1010. A first terminal of the AND gate 1040 is coupled to an input terminal of the delay unit 1030, and a second terminal is coupled to an output terminal of the delay unit 1030. Two input terminals of the SR flip-flop 1050 are coupled to the AND gates 1020 and 1040 respectively.

During the operation, the delay unit 1010 and the AND gate 1020 form a pulse-width reduction circuit. Similarly, the delay unit 1030 and the AND gate 1040 form another pulse-width reduction circuit. Thus, the SR flip-flop 1050 uses the pulse-width reduction circuits to receive the delay clock signal $V_{DE}$ and the matched clock signal $V_{MT}$ respectively, so as to avoid the situation that both signals received by the SR flip-flop 1050 are at the high level. Then, the SR flip-flop 1050 generates the adjustable clock signal $V_{PG}$ according to the two received signals.

It should be noted that each of the delay units 1010 and 1030 includes three inverters connected in series. For example, the delay unit 1010 includes inverters 1011-1013, and the delay unit 1030 includes inverters 1031-1033. However, those skilled in the art would understand that a different number of inverters may used in the delay circuits 1010 and 1030 according to design requirements to enhance the functions of the edge combining unit 930.

Figure 11:
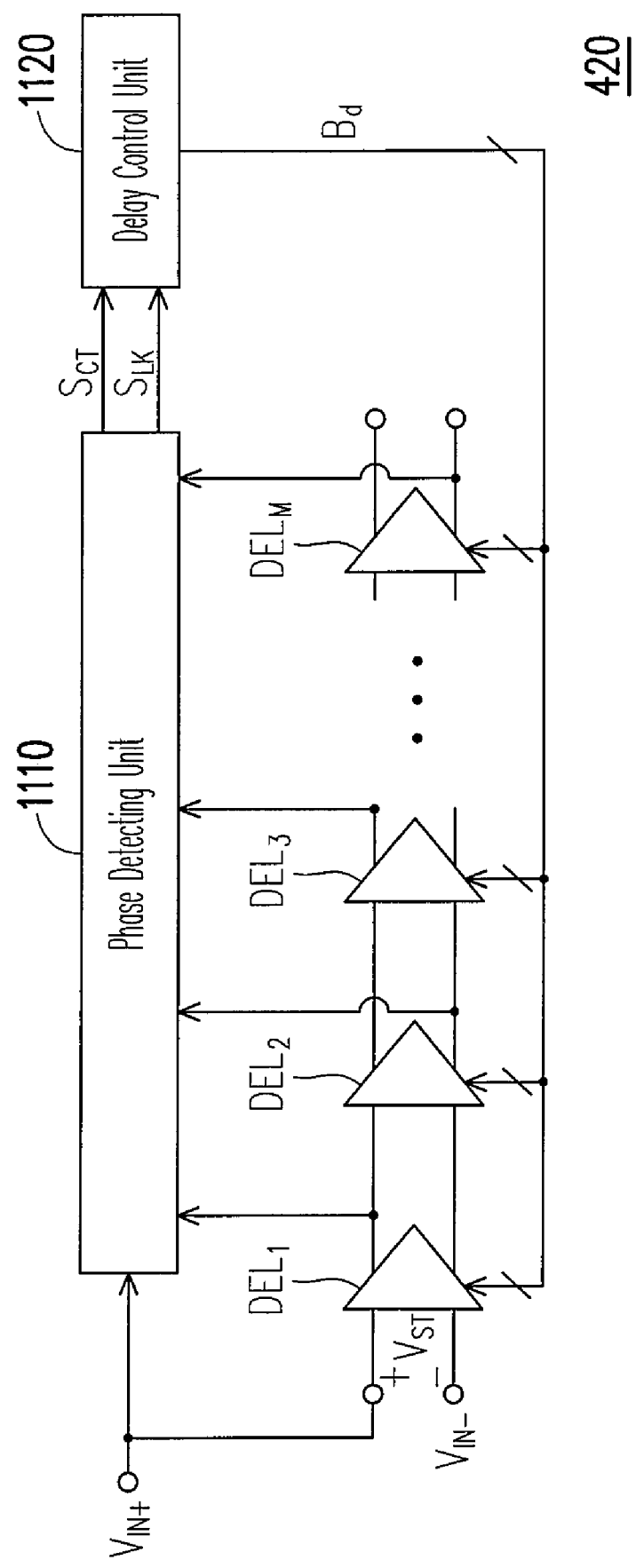
FIG. 11 is an architectural view of a digital delay locked loop according to an embodiment of the present invention.

FIG. 11 is an architectural view of a digital delay locked loop according to the embodiment of the present invention. Referring to FIG. 11, a digital phase locked loop 420 includes a phase detecting unit 1110, controllable delay circuits $DEL_1$-$DEL_M$, and a delay control unit 1120, wherein M is an integer, and $1 \leq M \leq 2^K+1$. The delay control unit 1120 is coupled to the phase detecting unit 1110. The controllable delay circuits $DEL_1$-$DEL_M$ are connected in series, and output terminals of the controllable delay circuits $DEL_1$-$DEL_M$ are coupled to the phase detecting unit 1110.

Referring to FIG. 11 again, as the controllable delay circuits $DEL_1$-$DEL_M$ adopt a double-ended design, the digital phase locked circuit 420 receives the differential signals of the specific period signal $V_{ST}$, i.e., the positive received signal $V_{IN+}$ and the negative received signal $V_{IN-}$. Here, the digital phase locked loop 420 regulates the positive received signal $V_{IN+}$ in the specific period signal $V_{ST}$ to a phase locked signal. In other words, in the locked state, the digital delay locked loop 420 generates the phase locked signal through one of the controllable delay circuits $DEL_1$-$DEL_M$.

During the operation, the controllable delay circuits $DEL_1$-$DEL_M$ transmit the specific delay signal $V_{ST}$ according to delay time determined by the delay control code $B_d$. In another aspect, the phase detecting unit 1110 samples the positive received signal $V_{IN+}$ in the specific period signal $V_{ST}$ at a transition point of the specific period signal $V_{ST}$ transmitted by each of the controllable delay circuits to provide a counting information $S_{CT}$ or a locking information $S_{LK}$.

Next, the delay control unit 1120 makes the delay control code $B_d$ increase or decrease according to the counting information $S_{CT}$. Thus, the delay control unit 1120, the controllable delay circuits $DEL_1$-$DEL_M$, and the phase detecting unit 1110 form a feedback mechanism. The digital phase locked loop 420 continuously regulates the delay control code $B_d$ through the feedback mechanism until the phase locked signal and the positive received signal $V_{IN+}$ have opposite phases. At this time, the digital phase locked loop 420 is in the locked state, and the delay control unit 1120 enables the delay control code $B_d$ to remain unchanged according to the locking information $S_{LK}$, so as to generate a specific delay control code $B_{sd}$.

It should be noted that the controllable delay circuits $DEL_1$-$DEL_M$ in the digital phase locked loop 420 have the same circuit architecture of the programmable delay circuits $DEL_{41}$-$DEL_{4N}$. However, referring to FIG. 5, the period of the specific period signal $V_{ST}$ transmitted by the controllable delay circuits $DEL_1$-$DEL_M$ is twice the period of the specific pulse-width signal $V_{SP}$ transmitted by the programmable delay circuits $DEL_{41}$-$DEL_{4N}$, i.e. twice as long as the period of the specific pulse-width signal $V_{SP}$ transmitted by the programmable delay circuits $DEL_{41}$-$DEL_{4N}$. Therefore, when the digital phase locked loop 420 generates the phase locked signal (the anti-phase signal of the specific period signal $V_{ST}$) through the $2^{K^{th}}$ controllable delay circuit $DEL_{2^K}$, the total delay time of the $2^{(K-1)}$ programmable delay circuits $DEL_{41}$-$DEL_{4N}$ is half as long as the period of the specific pulse-width signal $V_{SP}$.

Figure 12:
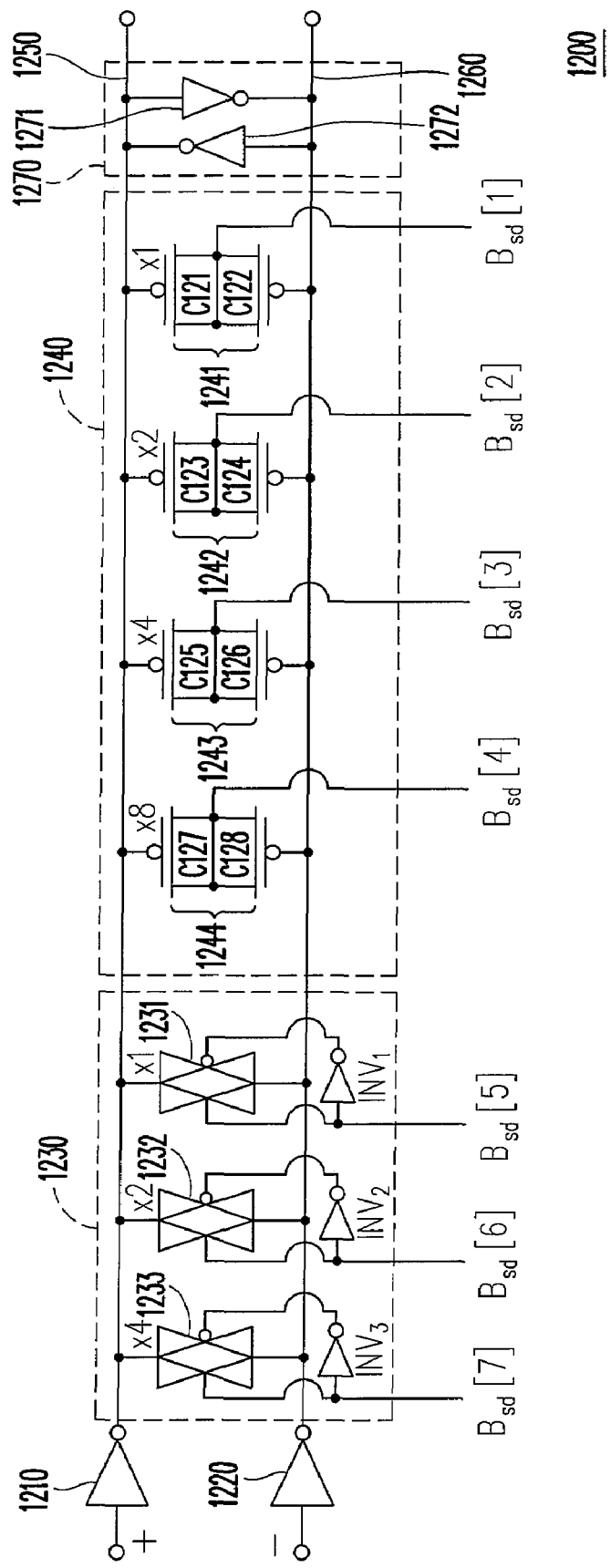
FIG. 12 is an architectural view of a programmable delay circuit according to an embodiment of the present invention.

FIG. 12 is an architectural view of a programmable delay circuit according to the embodiment of the present invention. Referring to FIG. 12, a programmable delay circuit 1200 includes inverters 1210 and 1220, a variable resistance unit 1230, a variable capacitance unit 1240, and a phase clamping unit 1270. Output terminals of the inverters 1210 and 1220 are coupled to signal lines 1250 and 1260 respectively, and the variable resistance unit 1230 and the variable capacitance unit 1240 are coupled between the signal lines 1250 and 1260.

It is assumed that the resolution of the specific delay control code $B_d$ is 7 bits, which are represented as $B_{sd}[1]$-$B_{sd}[7]$ respectively, in which $B_{sd}[1]$-$B_{sd}[4]$ are a set of less significant bits, $B_{sd}[5]$-$B_{sd}[7]$ are a set of more significant bits, $B_{sd}[1]$ is the least significant bit, and $B_{sd}[7]$ is the most significant bit.

By the use of the variable resistance unit 1230 and the variable capacitance unit 1240, the programmable delay circuit 1200 can regulate the delay time that can be provided according to the specific delay control code $B_{sd}$. The variable resistance unit 1230 regulates an equivalent resistance between the signal lines 1250 and 1260 according to $B_{sd}[5]$-$B_{sd}[7]$, and the variable capacitance unit 1240 regulates an equivalent capacitance between the signal lines 1250 and 1260 according to $B_{sd}[1]$-$B_{sd}[4]$.

Referring to FIG. 12 again, the variable resistance unit 1230 includes transmission gates 1231-1233 and inverters $INV_1$-$INV_3$. The variable resistance unit 1230 regulates the equivalent resistance between the signal lines 1250 and 1260 according to the ON/OFF state of the transmission gates 1231-1233. The ON/OFF state of the transmission gate 1231 is controlled by $B_{sd}[5]$ through the inverter $INV_1$. Similarly, the ON/OFF states of the transmission gates 1232 and 1233 are controlled by $B_{sd}[6]$ and $B_{sd}[7]$ through the inverters $INV_2$ and $INV_3$ respectively. Thus, the variable resistance unit 1230 can regulate the equivalent resistance between the signal lines 1250 and 1260 according to $B_{sd}[5]$-$B_{sd}[7]$.

It should be noted that the variable resistance unit 1230 increases device sizes of the transmission gates 1232 and 1233 by the power of 2 with reference to a device size of the transmission gate 1231 sequentially.

In another aspect, the variable capacitance unit 1240 includes variable capacitors 1241-1244, and each of the variable capacitors 1241-1244 includes two capacitors. For example, the variable capacitor 1241 includes capacitors C121 and C122, the variable capacitor 1242 includes capacitors C123 and C124. The components included in the variable capacitors 1243 and 1244 can be derived from the above description.

The variable capacitance unit 1240 regulates the equivalent capacitance between the signal lines 1250 and 1260 by varying the capacitance values of the variable capacitors 1241-1244. The capacitance value of the variable capacitor 1241 is controlled by $B_{sd}[1]$. Similarly, the capacitance values of the variable capacitors 1242-1244 are controlled by the bits $B_{sd}[2]$-$B_{sd}[4]$ respectively. Thus, the variable capacitance unit 1240 can regulate the equivalent capacitance between the signal lines 1250 and 1260 according to $B_{sd}[1]$-$B_{sd}[4]$.

It should be noted that the variable capacitance unit 1240 increases device sizes of the variable capacitors 1242-1244 by a power of 2 with reference to a device size of the variable capacitor 1241 sequentially. In addition, the capacitors C121-C128 forming the variable capacitors 1241-1244 are PMOS capacitors.

Moreover, the phase clamping unit 1270 includes inverters 1271 and 1272. Here, the programmable delay circuit 1200 can use the phase clamping unit 1270 to enable output signals of the inverters 1210 and 1220 have opposite phases.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital pulse-width control apparatus, comprising:
   an input module, for regulating a clock signal to a specific period signal and a specific pulse-width signal;
   a digital delay locked loop, for receiving the specific period signal and generating a specific delay control code in a locked state;
   a plurality of programmable delay circuits, connected in series, each of the programmable delay circuits sequentially transmitting the specific pulse-width signal according to delay time determined by the specific delay control code, wherein total delay time of the programmable delay circuits is 0.5 times of a period of the specific pulse-width signal; and
   a pulse-width modulation module, for selecting one of output signals of the programmable delay circuits according to a pulse-width control code to function as a delay clock signal, and generating an adjustable clock signal or an anti-phase signal of the adjustable clock signal by comparing transition points of a compensated specific pulse-width signal and the delay clock signal.

2. The digital pulse-width control apparatus as claimed in claim 1, wherein a duty cycle of the specific period signal is 50%, and a pulse-width of the specific pulse-width signal is directly proportional to a specific time.

3. The digital pulse-width control apparatus as claimed in claim 1, wherein the input module comprises:
   a frequency dividing unit, for reducing a frequency of the clock signal to the specific period signal by a specific factor; and
   an up-conversion unit, coupled to the frequency dividing unit, for raising a frequency of an output signal of the frequency dividing unit to the specific pulse-width signal by a specific factor, wherein a pulse-width of the specific pulse-width signal is directly proportional to a specific time.

4. The digital pulse-width control apparatus as claimed in claim 3, wherein the specific period signal comprises a positive received signal and a negative received signal, and the frequency dividing unit comprises:
   a first D flip-flop, having a trigger terminal for receiving the clock signal, an input terminal, and an anti-phase terminal coupled with its input terminal;
   a buffer, coupled to a positive-phase output terminal of the first D flip-flop, for generating the specific period signal; and
   a complementary signal generator, coupled to the buffer, for generating differential signals corresponding to the specific period signal and outputting the differential signals as the positive received signal and the negative received signal respectively.

5. The digital pulse-width control apparatus as claimed in claim 4, wherein the input module further provides a counting signal to the digital delay locked loop, and the frequency dividing unit further comprises:
   a second D flip-flop, having a trigger terminal coupled to the buffer, an input terminal, an anti-phase output terminal coupled with its input terminal, and a positive-phase output terminal for receiving the counting signal.

6. The digital pulse-width control apparatus as claimed in claim 3, wherein the specific pulse wave signal comprises a positive pulse wave signal and a negative pulse wave signal, and the up-conversion unit comprises:
   a delay circuit, for delaying an output signal of the frequency dividing unit for the specific time, and outputting the output signal;
   an XOR gate, coupled to the frequency dividing unit and the delay circuit to generate the specific pulse-width signal; and
   a complementary signal generator, coupled to the XOR gate, for generating differential signals corresponding to the specific pulse-width signal and outputting the differential signals as the positive pulse wave signal and the negative pulse wave signal respectively.

7. The digital pulse-width control apparatus as claimed in claim 1, wherein the pulse-width modulation module comprises:
a first multiplexer, for selecting one of output signals of the programmable delay circuits and outputting the selected output signal as the delay clock signal according to the pulse-width control code;
a matching unit, for receiving and delaying the specific pulse-width signal to output the compensated specific pulse-width signal as a matched clock signal;
an edge combining unit, for using a phase difference between the delay clock signal and the matched clock signal to generate an adjustable clock signal, wherein a pulse-width of the adjustable clock signal is directly proportional to the phase difference;
an inverter, for receiving the adjustable clock signal to generate an anti-phase signal of the adjustable clock signal; and
a second multiplexer, coupled to an input terminal and an output terminal of the inverter, for selecting and outputting one of the adjustable clock signal and the anti-phase signal of the adjustable clock signal according to the pulse-width control code.

8. The digital pulse-width control apparatus as claimed in claim 7, wherein the edge combining unit comprises:
a first delay unit, for receiving the delay clock signal;
a first AND gate, having a first terminal coupled to an input terminal of the first delay unit, and a second terminal coupled to an output terminal of the first delay unit;
a second delay unit, for receiving the matched clock signal;
a second AND gate, having a first terminal coupled to an input terminal of the second delay unit, and a second terminal coupled to an output terminal of the second delay unit; and
an SR flip-flop, having a first input terminal coupled to the first AND gate, a second terminal coupled to the second AND gate and an output terminal, for generating the adjustable clock signal.

9. The digital pulse-width control apparatus as claimed in claim 8, wherein the first delay unit and the second delay unit respectively comprise three inverters connected in series.

10. A digital pulse-width control apparatus, comprising:
an input module, for regulating a clock signal to a specific period signal and a specific pulse-width signal;
a digital delay locked loop, comprising:
$2^K+1$ controllable delay circuits, connected in series, each of the controllable delay circuits transmitting the specific period signal according to delay time determined by a delay control code, wherein K is a positive integer;
a phase detecting unit, coupled to each of the controllable delay circuits, for sampling the specific period signal at the transition points of the specific period signal transmitted by each of the controllable delay circuits, and determining sample results to provide a counting information or a locking information; and
a delay control unit, coupled to the phase detecting unit, for enabling the delay control code to increase or decrease according to the counting information, and enabling the delay control code to remain unchanged according to the locking information, so as to further generate a specific delay control code;
$2^{K-1}$ programmable delay circuits, connected in series, each of the programmable delay circuits sequentially transmitting the specific pulse-width signal according to delay time determined by the specific control code, wherein total delay time of the programmable delay circuits is 0.5 times of a period of the specific pulse-width signal; and
a pulse-width modulation module, for selecting one of output signals of the programmable delay circuits for transmitting the specific pulse-width signal according to a pulse-width control code to function as a delay clock signal, and generating an adjustable clock signal or an anti-phase signal of the adjustable clock signal by comparing transition points of the compensated specific pulse-width signal and the delay clock signal.

11. The digital pulse-width control apparatus as claimed in claim 10, wherein in the locked state, the digital delay locked loop generates a phase locked signal by the use of a $(2^K)^{th}$ controllable delay circuit thereof, and the phase locked signal and the specific period signal are in opposite phases.

12. The digital pulse-width control apparatus as claimed in claim 10, wherein a duty cycle of the specific period signal is 50%, and a pulse-width of the specific pulse-width signal is directly proportional to a specific time.

13. The digital pulse-width control apparatus as claimed in claim 10, wherein the input module comprises:
a frequency dividing unit, for reducing a frequency of the clock signal to the specific period signal by a specific factor; and
an up-conversion unit, coupled to the frequency dividing unit, for raising a frequency of an output signal of the frequency dividing unit to the specific pulse-width signal by a specific factor, wherein a pulse-width of the specific pulse-width signal is directly proportional to a specific time.

14. The digital pulse-width control apparatus as claimed in claim 13, wherein the specific period signal includes a positive received signal and a negative received signal, and the frequency dividing unit comprises:
a first D flip-flop, having a trigger terminal for receiving the clock signal, an input terminal, and an anti-phase output terminal coupled to its input terminal;
a buffer, coupled to a positive-phase output terminal of the first D flip-flop to generate the specific period signal; and
a complementary signal generator, coupled to the buffer, for generating differential signals corresponding to the specific period signal and outputting the differential signals as the positive received signal and the negative received signal respectively.

15. The digital pulse-width control apparatus as claimed in claim 13, wherein the specific pulse wave signal comprises a positive pulse wave signal and a negative pulse wave signal, and the up-conversion unit comprises:
a delay circuit, for delaying an output signal of the frequency dividing unit for the specific time and outputting the output signal;
an XOR gate, coupled to the frequency dividing unit and the delay circuit, for generating the specific pulse-width signal; and
a complementary signal generator, coupled to the XOR gate, for generating differential signals corresponding to the specific pulse-width signal and outputting the differential signals as the positive pulse wave signal and the negative pulse wave signal respectively.

16. The digital pulse-width control apparatus as claimed in claim 10, wherein the pulse-width modulation module comprises:

a first multiplexer, for selecting one of output signals of the programmable delay circuits and outputting the selected output signal as the delay clock signal according to the pulse-width control code;

a matching unit, for receiving and delaying the specific pulse-width signal to output the compensated specific pulse-width signal as a matched clock signal;

an edge combining unit, for using a phase difference between the delay clock signal and the matched clock signal to generate an adjustable clock signal, wherein a pulse-width of the adjustable clock signal is directly proportional to the phase difference;

an inverter, for receiving the adjustable clock signal; and a second multiplexer, coupled to an input terminal and an output terminal of the inverter, for selecting and outputting one of the adjustable clock signal and the anti-phase signal of the adjustable clock signal according to the pulse-width control code.

* * * * *